United States Patent [19]
Vogelsang et al.

[11] Patent Number: 6,049,492
[45] Date of Patent: Apr. 11, 2000

[54] INTERLEAVED SENSE AMPLIFIER WITH A SINGLE-SIDED PRECHARGE DEVICE

[75] Inventors: Thomas Vogelsang, Williston; Michael Killian, Richmond, both of Vt.

[73] Assignee: Siemens Aktiengesellschaft, Munich, Germany

[21] Appl. No.: 09/107,191

[22] Filed: Jun. 29, 1998

[51] Int. Cl.[7] .................................................. G11C 7/00
[52] U.S. Cl. .............................................. 365/196; 365/203
[58] Field of Search .............................. 365/185.21, 203, 365/189.02, 191, 196, 202

[56] References Cited

U.S. PATENT DOCUMENTS

| | | | |
|---|---|---|---|
| 4,656,613 | 4/1987 | Norwood et al. | 365/208 |
| 4,954,987 | 9/1990 | Auvinen et al. | 365/189.02 |
| 5,267,214 | 11/1993 | Fujishima | 365/230.03 |
| 5,521,869 | 5/1996 | Tamihro et al. | 365/189.01 |
| 5,673,231 | 9/1997 | Furutani | 365/203 |
| 5,717,645 | 2/1998 | Kengeri et al. | 365/230.01 |
| 5,754,478 | 5/1998 | Morgan et al. | 365/189.01 |
| 5,764,562 | 6/1998 | Hamamoto | 365/149 |

FOREIGN PATENT DOCUMENTS

0 323 172   7/1989   European Pat. Off. .
2310745     9/1997   United Kingdom .

Primary Examiner—David Nelms
Assistant Examiner—Thong Le
Attorney, Agent, or Firm—Donald B. Paschburg

[57] ABSTRACT

An interleaved sense amplifier with a single sided precharge device which provides simplification of the conventional sense amplifier circuitry, as well as a reduction in the area occupied by the sense amplifier circuitry, thereby resulting in chip size reduction. A precharge device is placed on only one side of the sense amplifier, which is used to charge both sets of bit lines pairs that are coupled to the sense amplifier to a common voltage during an equalization/precharge operation. In addition, the resistance of the transistors comprising the precharge device is increased such that the precharge transistors can be further utilized for limiting the flow of current between the bit line pair and precharge net, which obviates the need for the additional leakage limiter devices in the conventional sense amplifier arrangement. Thus, a compact and simplified sense amplifier architecture is realized.

10 Claims, 4 Drawing Sheets

INTERLEAVED SENSE AMPLIFIER WITH A SINGLE-SIDED PRECHARGE DEVICE

BACKGROUND OF THE INVENTION

1. Technical Field of the Invention

The present invention generally relates to semiconductor memory devices and, more particularly, to an interleaved sense amplifier with a single sided precharge device which provides for simplification, as well as a reduction in the area of occupation, of conventional sense amplifier circuitry, thereby resulting in chip size reduction.

2. Description of the Related Art

Currently, many dynamic semiconductor memory devices such as dynamic random access memory (DRAM) utilize folded bit line, interleaved sense amplifier arrangements, whereby two sets of paired bit lines (from a plurality of paired bit lines) are coupled to, and share a single sense amplifier. Referring to FIG. 1, a circuit diagram is shown of a representative portion in a DRAM of a configuration for a conventional interleaved sense amplifier. In general, each bit line pair ("BL") includes a bit line true ("BLt") and a bit line complement ("BLc"), the BLt and BLc each being connected to a plurality of dynamic memory cells (not shown) in a memory array (not shown) comprising the DRAM. As is known in the art, each memory cell includes a capacitor (not shown) for storing a charge which indicates whether the cell is in a logic "1" or logic "0" state. The charge associated with a given memory cell may be coupled onto its corresponding bit line when addressed by a wordline connected to the memory cell.

The illustrated portion of FIG. 1 has four pairs of bit lines identified as BLta(0) BLca(0)–(the "upper left bit line pair"), BLta(2)–BLca(2) (the "lower left bit line pair"), BLtb(0)–Blcb(0) (the "upper right bit line pair"), and BLtb(2)–Blcb(2) (the "lower right bit line pair"). The upper left bit line pair is coupled to one side of a sense amplifier S1 via isolation transistors T4 and T5. The upper right bit line pair is coupled to the other side of sense amplifier S1 via isolation transistors T12 and T13. Similarly, the lower left bit line pair is coupled to one side of a sense amplifier S2 via isolation transistors T23 and T24 and the lower right bit line pair is coupled to the other side of sense amplifier S2 via isolation transistors T31 and T32. The gates of isolation transistor pairs T4, T5 and T23, T24 are connected to a MUXa signal line and the gates of isolation transistor pairs T12, T13 and T31, T32 are connected to a MUXb signal line. In response to a MUXa signal, isolation transistors T4 and T5 are energized to couple the upper left bit line pair to the sense amplifier S1, and isolation transistors T23 and T24 are energized to couple the lower left bit line pair to the sense amplifier S2. Likewise, a MUXb signal causes isolation transistors T12 and T13 to couple the upper right bit line pair to sense amplifier S1 and isolation transistors T31 and T32 to couple the lower right bit line pair to the sense amplifier S2.

The sense amplifiers S1 and S2 each include an N-Sense cross-coupled latch (i.e., transistors T8 and T9 in S1 and transistors T27 and T28 in S2) and a P-Sense cross-coupled latch (i.e., transistors T10 and T11 in S1 and transistors T29 and T30 in S2). The N-sense latches operate in response to an NCS signal and the P-sense latches operate in response to a PCS signal, which causes each of the sense amplifiers to sense and amplify a potential difference between a selected one of the bit lines pairs (i.e., sense amplifier nodes SAt(0) and SAc(0) for S1 and nodes SAt(2) and SAc(2) for S2). In addition, each sense amplifier includes a bit switch, i.e., transistors T6 and T7 for S1 and transistors T25 and T26 for S2, which is used for coupling the sense amplifier S1 nodes to local data lines LDQt(0) and LDQc(0) and sense amplifier S2 nodes to local data lines LDQt(2) and LDQc(2), respectively, in response to a CSL (column select) signal.

The circuit of FIG. 1 includes four precharge devices P1, P2, P3 and P4. The precharge device P1 (consisting of precharging transistors T1 and T3 and an equalization transistor T3) is connected between the upper left bit line pair (BLta(0) and BLca(0)) and operates by shorting the upper left bit line pair together and then precharging the pair to a common voltage level during an equalization/precharge operation. The precharge device P2 (consisting of precharging transistors T14 and T15 and an equalization transistor T16) is connected between the upper right bit line pair (BLtb(0) and BLcb(0)) and, likewise, operates by shorting the upper right bit line pair together and precharging the pair to a common voltage level during the equalization/precharge operation. The precharge devices P3 (transistors T17, T18 and T19) and P4 (transistors T20, T21 and T22) are connected between the lower left bit line pair and lower right bit line pair, respectively, and operate in a similar manner as discussed above for precharge devices P1 and P2. The equalization transistors T3 and T19 are responsive to equalization signal EQLa and transistors T16 and T20 are responsive to equalization signal EQLb.

A leakage limiter device LL1 is operatively coupled to precharge devices P1 and P3 for limiting the precharge current supplied by a voltage source VBLEQ during the equalization/precharge operation. Likewise, a leakage limiter device LL2 is operatively coupled to precharge devices P2 and P4 for limiting the precharge current supplied by the voltage source VBLEQ during the equalization/precharge operation. Moreover, in the event of a wordline—bitline short whereby a current path is formed from the grounded wordline through the short to the bitline and then from the bitline through a corresponding precharge device to the VBELQ precharge net (i.e., the wiring that supplies the precharge voltage VBELQ to all the sense amplifiers on the chip), the leakage limiter device adds resistance in the path between the corresponding precharge device and the VBELQ precharge net. Consequently, the flow of standby leakage current resulting from each wordline—bitline short is limited by the resistance provided by the leakage limiter device that is located in the path between the precharge device and VBELQ precharge net.

The circuit of FIG. 1 generally operates as follows. Assume that during a read operation, data from a selected memory cell (not shown) in the memory array (not shown) is coupled to one of the bit lines of the upper left bit line pair, i.e., BLta(0) and BLca(0). Prior to the read operation, an equalization/precharge operation is performed to short the BLta(0) and BLca(0) bit lines together and charge them to a common voltage level. The precharge voltage VBELQ is coupled to the precharge device P1 via the leakage limiter device LL1 which, as stated above, provides resistance to limit the amount of charging current supplied by the VBELQ net for bringing the upper left bit line pair to the common voltage. Subsequently, during the read operation, charge from the memory cell is coupled to the corresponding bit line which causes the common voltage on that bit line to be altered. The sense amplifier S1 then operates to amplify the potential difference between the upper left bit line pair, amplify the signal flowing in either the BLta(0) or BLca(0) (whichever one was altered from the transfer of charge between the memory cell) and then restore the charge to the associated memory cell before the read operation is complete In general, large capacity DRAM chips contain a significant amount of sense amplifiers which occupy space on the surface of the chips. With the demand for higher capacity memory chips, however, it has become increasingly important to conserve and utilize the available chip surface area as efficiently as possible. As shown in FIG. 1, each of the four bit line pairs has a precharge device and a leakage limiter device associated therewith and, consequently, each sense amplifier S1 and S2 has two precharge devices associated therewith. In addition, the leakage limiter devices LL1 and LL2 in FIG. 1 are generally implemented as depletion NFETs or enhancement NFETs. In comparison, depletion NFETs have better electrical properties and a relatively smaller layout size than enhancement NFETs, but require an additional channel implant process which increases the manufacturing cost to make them. Moreover, enhancement NFETs require a long channel to increase the resistance which results in a large layout size. Consequently, the area which is occupied by the precharge devices for each of the sense amplifiers and their associated leakage limiting devices significantly contributes to the chip area, as well as increased manufacturing costs of the DRAM. Accordingly, by reducing the size of the sense amplifier and it associated circuitry and/or reducing the number of constituent or associated elements of the sense amplifier, a significantly smaller chip size can be realized.

SUMMARY OF THE INVENTION

The present invention is directed to an interleaved sense amplifier with a single sided precharge device which provides simplification of the conventional sense amplifier circuity, as well as a reduction in the area occupied by the sense amplifier circuitry, thereby resulting in chip size reduction. In particular, the present invention involves placing a precharge device on only one side of the sense amplifier, which is used to charge both sets of bit lines pairs that are coupled to the sense amplifier to a common voltage during an equalization/precharge operation. In addition, the resistance of the transistors comprising the precharge device is increased such that the precharge transistors can be further utilized for limiting the flow of current between the bit line pair and precharge net, which obviates the need for the additional leakage limiter devices in the conventional sense amplifier arrangement. Thus, a compact and simplified sense amplifier architecture is realized.

These and other objects, features and advantages of the present invention will become apparent from the following detailed description of illustrative embodiments, which is to be read in connection with the accompanying drawings.

DETAILED DESCRIPTION OF PREFERRED EMBODIMENTS

Figure 1:
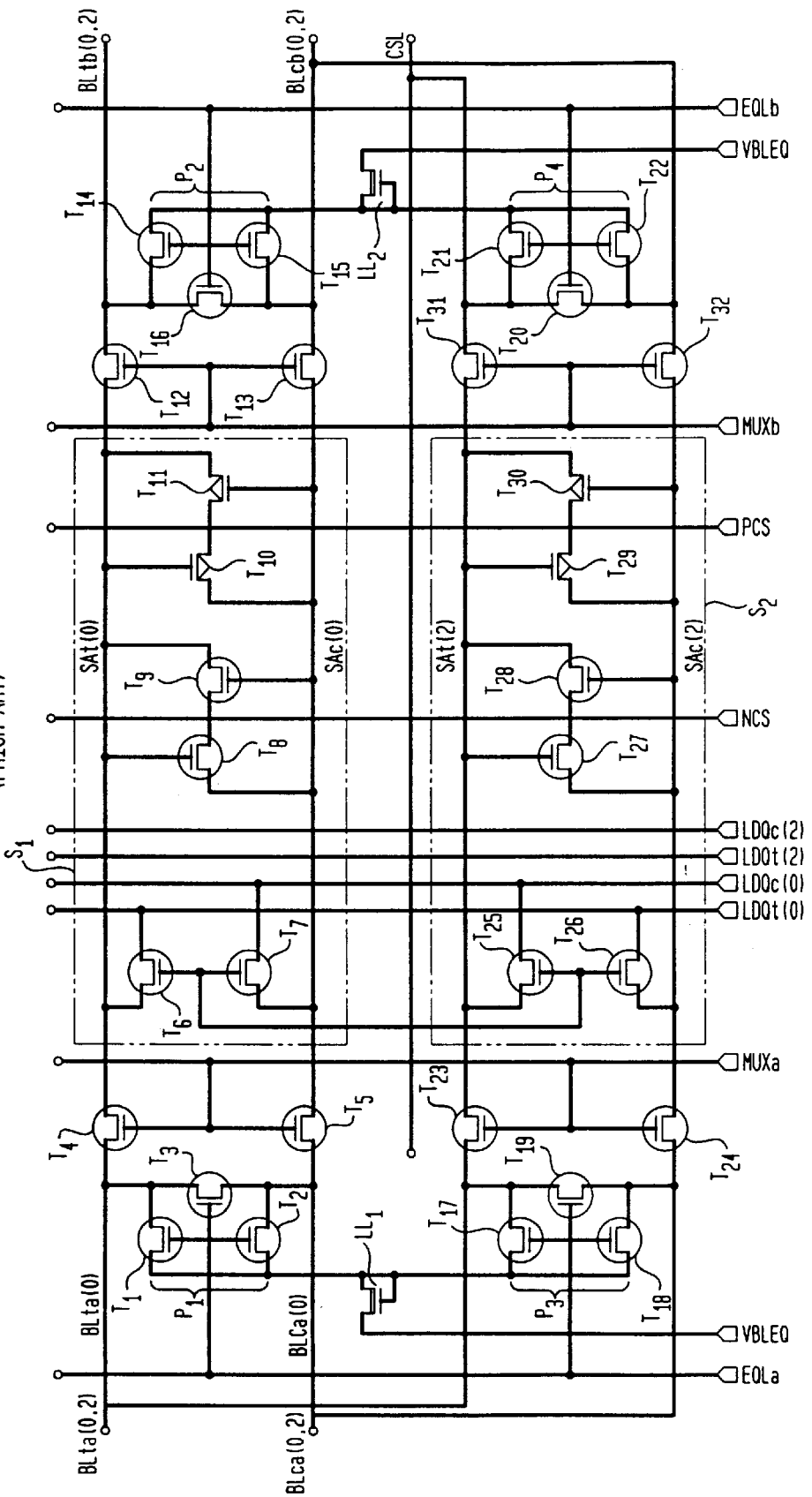
FIG. 1 is a circuit diagram illustrating a representative portion in a folded bit line DRAM configuration for a conventional interleaved sense amplifier.
Figure 2:
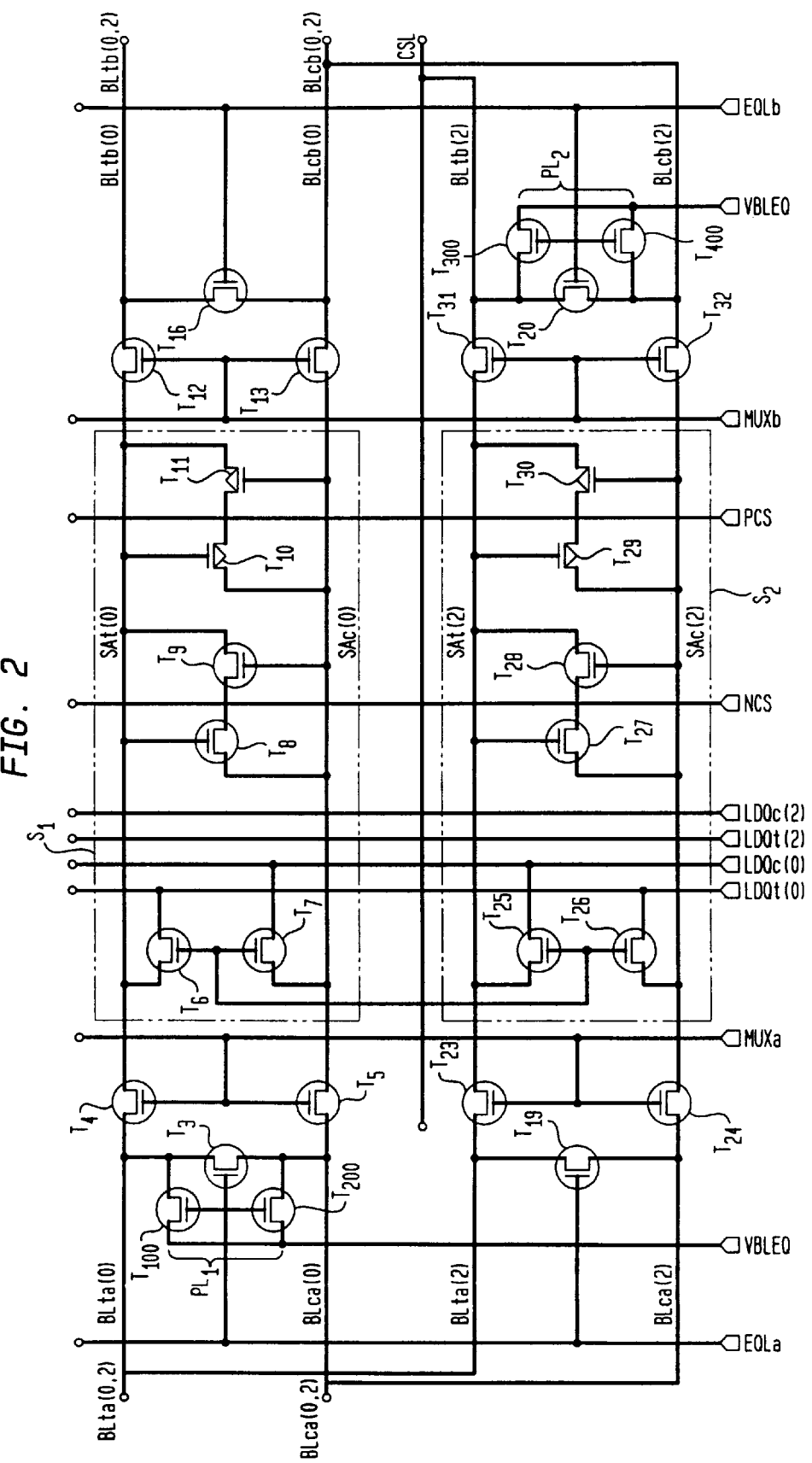
FIG. 2 is a circuit diagram illustrating a representative portion in a folded bit line DRAM configuration for an interleaved sense amplifier in accordance with an embodiment of the present invention.

Referring to FIG. 2, a circuit diagram is shown of a representative portion in a folded bit line DRAM configuration for an interleaved sense amplifier with a single precharge device in accordance with an embodiment of the present invention. As in the conventional circuit of FIG. 1, the sense amplifier S1 is shared between the upper left bit line pair (i.e., BLta(0) and BLca(0)) and the upper right bit line pair (i.e., BLtb(0) and BLcb(0)), and the sense amplifier S2 is shared between the lower left bit line pair (i.e., BLta(2) an BLca(2)) and the lower right bit line pair (i.e., BLtb(2) and BLcb(2)). In addition, the upper left bit line pair and the upper right bit line pair are coupled to the sense amplifier S1 (i.e., sense amplifier nodes SAt(0) and SAc(0)) via the isolation transistor pairs T4, T5 and T12, T13, respectively. Likewise, the lower left and lower right bit line pairs are coupled to the sense amplifier S2 (i.e., sense amplifier nodes SAt(2) and SAc(2)) via the isolation transistor pairs T23, T24 and T31, T32, respectively.

The circuit shown in FIG. 2 is contrasted with the conventional sense amplifier circuitry in that a single precharge device is used only on the left or the right side of the interleaved sense amplifier. Specifically, a single precharge device PL1 consisting of transistors T100 and T200 is provided to charge the upper left bit line pair, as well as the upper right bit line pair, during the equalization/precharge operation. In addition, a single precharge device PL2 consisting of transistors T300 and T400 is provided to charge the lower right bit line pair, as well as the lower left bit line pair, during the precharge operation. Equalization transistors T3 and T16 are provided on both sides of sense amplifier S1 in order to quickly equalize the upper left and upper right bit line pairs as in the conventional circuit (i.e., to connect the upper left bit line pair and connect the upper right bit line pair, respectively, during equalization/precharge). Likewise, equalization transistors T19 and T20 are placed on both sides of sense amplifier SA2 in order to connect the lower left bit line pair and connect the lower right bit line pair, respectively, during equalization/precharge.

Figure 3:
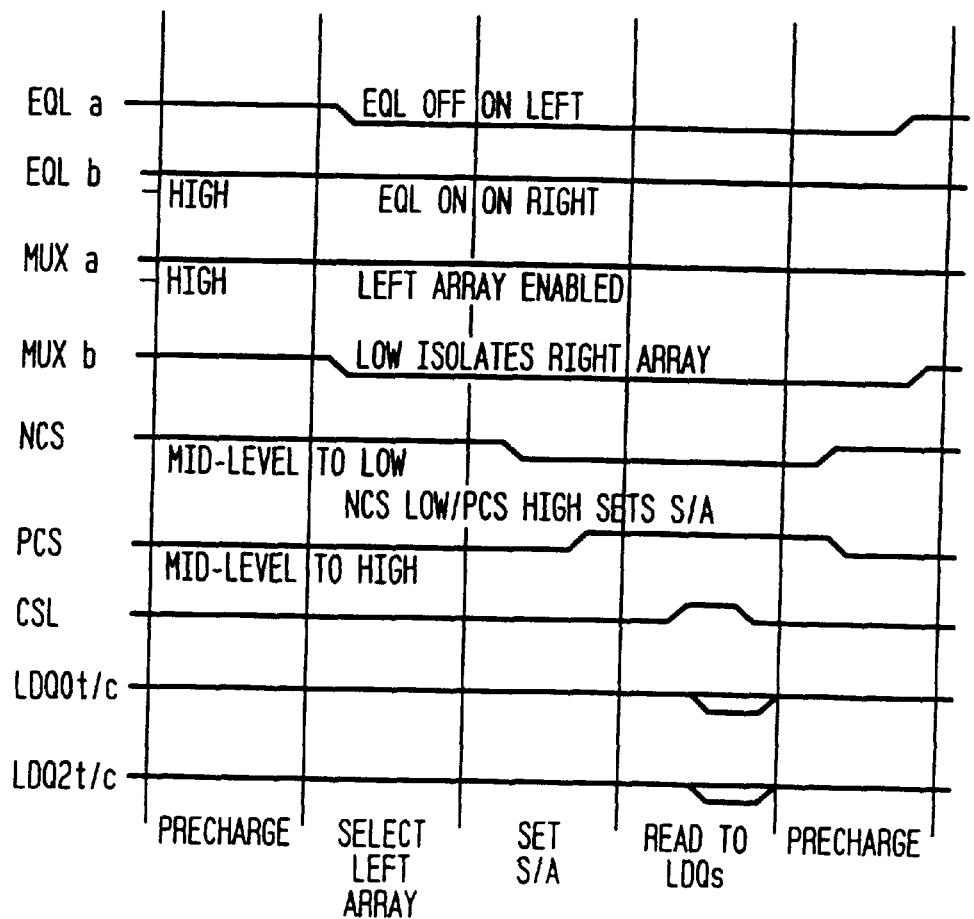
FIG. 3 is a timing diagram illustrating a precharge and data reading operation of the bit line sense amplifier of FIG. 2 in accordance with the present invention.

The operation of the circuit of FIG. 2 will now be described by way of example with reference to FIG. 3, which is a timing diagram illustrating a precharge and data reading operation of the sense amplifier in accordance with the present invention. In order to sense the upper left bit line pair, for example, the following occurs. Initially, the equalization/precharge operation is performed whereby the signal EQLa is supplied to the gate terminals of equalization transistor T3 and T19 to short the upper left bit lines together, and signal EQLb is supplied to the gate terminals of transistors T16 and T20 so as to short the upper right bit line pair together. In addition, the signals MUXa and MUXb are supplied to energize the isolation transistor pairs T4, T5 and T12, T13, respectively, which causes both of the upper bit line pairs to be coupled to one another and to the sense amplifier nodes SAt(0) and SAc(0). The voltage source VBELQ is supplied to charge both bit line pairs (as well as the sense amplifier nodes) to a common mid-level voltage of approximately 0.75 volts (a logic "1" for the memory array is approximately 1.5 volts).

Next, in order to read the memory cells (not shown) connected the upper left bit line pair, for example, the MUXb signal is turned off, which causes isolation transistors T12 and T13 to turn off, thus, isolating the upper right bit line pair from the sense amplifier S1. The voltage on the upper right bit line pair will float at approximately mid-level voltage. The equalization signal EQLa is then turned off, causing the upper left bit lines and sense amplifier nodes SAt(0) and SAc(0) to float at mid-level voltage. Next, when a wordline signal (not shown) is supplied to the memory array (not shown), the charge of a selected memory cell (not shown) is coupled to either the BLta(0) (i.e., bit line true) or BLca(0) (i.e., bit line complement). The selected memory cell may either dump charge (if the cell is logic "1") onto the bit line causing the floating mid-level voltage to go slightly higher, or absorb charge from the bit line (if the cell is logic "0") causing the mid-level voltage to go slightly lower. In either event, a slight voltage differential exists between the bit line pair, which are both in a floating voltage state. During this time, the sense signals NCS and PCS are at mid-level voltage. In order to amplify the bit line signal to a full swing, the NCS signal is brought to ground potential to enable the N-set cross-coupled latch, and the PCS signal is then brought high making node PCS the power supply for the P-set cross-coupled latch in a manner understood by those of ordinary skill in the art. The final latched state of the sense amplifier S1 represents the logic level of the addressed memory cell.

After amplification, the bit switch consisting of transistors T6 and T7 may be turned on by signal CSL, which causes the voltage on the sense amplifier nodes SAt(0) and SAc(0) to be coupled to the local data lines LDQt(0) and LDQc(0). Thereafter, the memory cell connected to the corresponding bit line (e.g., BLta(0) or BLca(a)) is refreshed with the latched bit line voltage, and the wordline signal is turned off.

Advantageously, the sense amplifier architecture of the present invention provides a significant reduction of the capacitive load on the equalizer lines ELQa and ELQb, which makes it possible to increase the channel length and, therefore, the channel resistance of transistors T100 and T200 of the precharge device PL1 and transistors T300 and T400 of the precharge device PL2. Specifically, since the sense amplifier shown in FIG. 2 utilizes one-half of the precharge devices of the conventional sense amplifier of FIG. 1, the channel length of the transistors T100, T200, T300 and T400 can be doubled without increasing the capacitive load on the corresponding EQL signal, which results in approximately a 100% increase of the resistance for each of the precharging transistors of the precharge devices.

Furthermore, in the conventional sense amplifier circuit, the leakage current that flows in a bitline due to a wordline—bitline short during the equalization/precharge phase will flow to the VBLEQ precharge net through both precharge devices on either side of the senses amplifier. For example, in FIG. 1, leakage current resulting from a wordline—bitline short in any one of the bit lines of the upper left and right bit line pairs will flow through both precharge devices P1 and P2, which decreases the effective resistance of these precharge devices by one-half (since they act as resistors in parallel). On the other hand, it is to be appreciated that in the sense amplifier circuit of the present invention shown in FIG. 2, a single precharge device PL1 is utilized for charging the upper right and left bit line pairs during equalization/precharge. Consequently, the leakage current resulting from a wordline bitline short in any one of the bit lines of the upper left and right bit line pairs will flow only through the precharge devices PL1, thus, making the effective resistance equal to the resistance of the precharge device PL1.

Advantageously, the combination of these two effects makes it possible to limit the leakage current using only the single precharge device without the need for a separate leakage limiter device. Specifically, by eliminating one precharge device from the sense amplifier circuitry and doubling the channel length (i.e., doubling the resistance) of the precharge transistors T100 and T200 (precharge device PL1) and 300 and T400 (precharge device PL2), the present invention provides an effective resistance which is approximately four times greater than the effective resistance of the conventional circuit. Consequently, the respective leakage limiting transistors LL1 and LL2 of FIG. 1 can be eliminated.

Figure 4A:
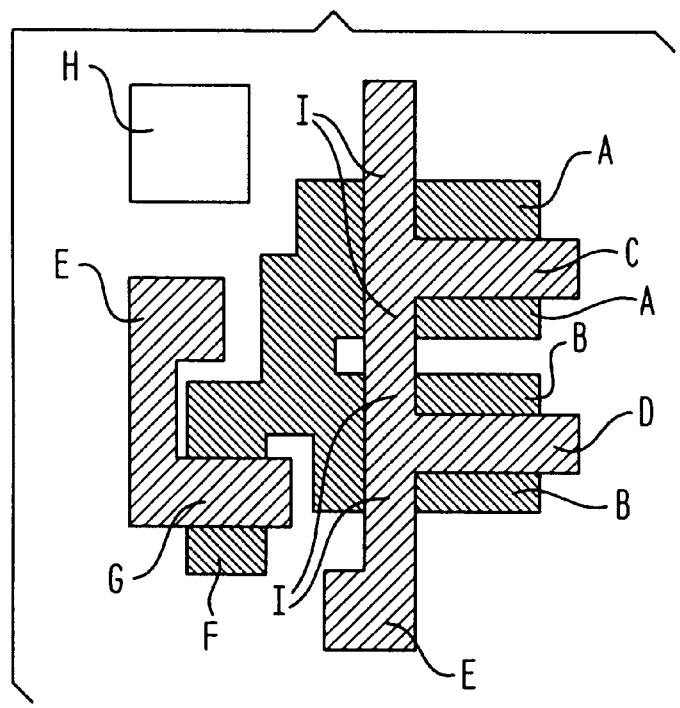
FIG. 4a is a diagram illustrating a relevant portion of the physical layout of the conventional sense amplifier circuitry.

In addition, the sense amplifier architecture of the present invention advantageously provides a significant reduction in the area of occupation as compared to the conventional sense amplifier. Referring now to FIG. 4a, a diagram illustrating a relevant portion of the physical layout of the conventional sense amplifier circuitry of FIG. 1 is shown. In FIG. 4a, the dashed areas represent gate conductor areas and the dotted area denotes an N-doped diffusion area (ND). The circuit elements of FIG. 1 are denoted as follows: Area A represents the diffusion contacts to the upper left bit line pair and area B represents diffusion contacts to the lower left bitline pair; Area C represents equalization transistor T3 and area D represents equalization transistor T19; Area E represents gate contact spaces; Area F represents the diffusion contact to VBLEQ; Area G represents the leakage limiter device LL1; Area H represents a well contact; and area I represents precharge transistors T1, T2, T17 and T18, respectively (from top to bottom). As shown, the precharge/equalization transistors arranged in a common T-shaped gate configuration to save area, but a second full stripe is required to include the precharge device and the well contacts.

Figure 4B:
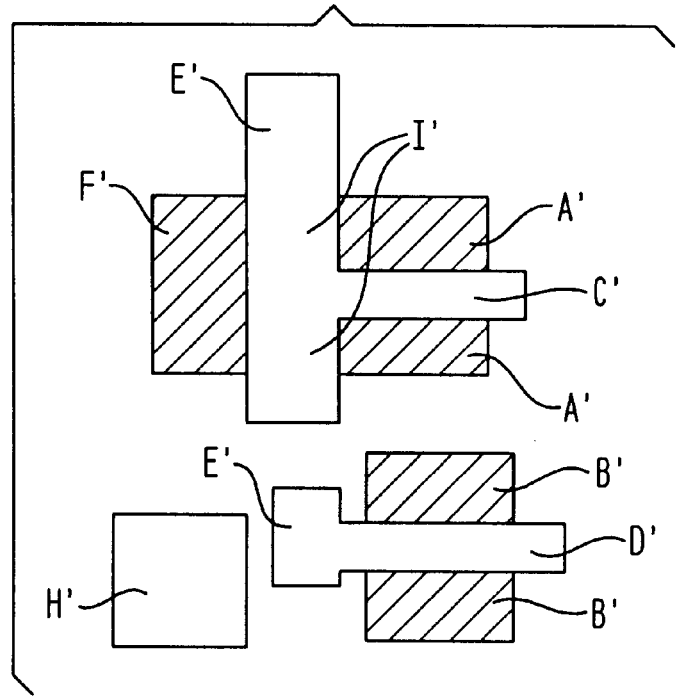
FIG. 4b is a diagram illustrating a relevant portion of a physical layout of a sense amplifier in accordance with an embodiment of the present invention.

Referring now to FIG. 4b, a diagram illustrating a relevant portion of a physical layout of a sense amplifier of FIG. 2 in accordance with an embodiment of the present invention is shown. The circuit elements of FIG. 2 are denoted as follows: Area A* represents the diffusion contacts to the upper left bit line pair and area B* represents diffusion contacts to the lower left bitline pair; Area C* represents equalization transistor T3 and area D* represents equalization transistor T19; Area E* represents gate contact spaces; Area F* represents the diffusion contact to VBLEQ; Area H* represents the well contact; and area I* represents precharge transistors T100 and T200, respectively (from top to bottom).

As shown, the leakage limiter device LL1 (denoted as area G in FIG. 4a) is eliminated in FIG. 4b, which provides for a reduction in the area needed for the device in the horizontal direction. In addition, additional space is saved in the horizontal direction by moving the well contact H* to an area which is partially between the equalization transistors (i.e., areas C* and D*). In order to prevent an increase of space occupied by the sense amplifier circuitry in the vertical direction (as a result of the placement of the well contact H* in the area illustrated in FIG. 4b), the precharge device is alternately positioned on opposite sides of vertically adjacent sense amplifiers. Specifically, as shown in FIG. 2, precharge device PL1 is placed on the left side of sense amplifier S1 and precharge device PL2 is placed on the right side of sense amplifier S2.

The resulting reduction of space in the horizontal direction between FIGS. 4a and 4b provides an overall decrease in the width of the sense amplifier architecture of FIG. 2. By way of example, assuming groundrules of a 0.175 $\mu$m technology, the actual reduction of the sense amplifier width is from 27.2 $\mu$m (with the conventional circuit having depletion leakage limiter devices LL1 and LL2) to 25.2 $\mu$m (with the sense amplifier circuit of the present invention), which represents a 7.5% reduction in the width of the sense amplifier. Therefore, by implementing the sense amplifier architecture of the present invention, the occupied area of the sense amplifier array in the DRAM chip can be significantly reduced.

Although the illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An interleaved sense amplifier, comprising:

a sense circuit having a first bit line pair and a second bit line pair electrically coupled thereto, for sensing and amplifying a potential difference between one of said first bit line pair and said second bit line pair; and a precharge circuit corresponding to said sense circuit, consisting essentially of a single precharge device operatively connected between said first bit line pair and between said second bit line pair, for charging said first bit line pair, said second bit line pair and said sense circuit to a common voltage prior to said sensing and amplifying.

2. The sense amplifier of claim 1, further comprising:

a first isolator circuit for selectivity coupling said first bit line pair and said sense circuit; and a second isolator circuit for selectively coupling said second bit line pair to said sense circuit; whereby said first and second isolators are simultaneously operative to couple said first bit line pair and said second bit line pair to said sense circuit such that said first bit line pair, said second bit line pair and said sense circuit can be charged to said common voltage by said precharge circuit.

3. The sense amplifier of claim 1, wherein said precharge circuit is adapted to limit an amount of charging current provided to charge said first bit line pair, said second bit line pair and said sense circuit to said common voltage.

4. The sense amplifier of claim 1, wherein said precharge circuit is adapted to limit an amount of leakage current flowing from one of said first bit line pair, said second bit line pair and both.

5. In a semiconductor memory having a plurality of pairs of bit lines, a interleaved sense amplifier circuit, comprising:

a sense circuit having a first sense node and a second sense node, for sensing and amplifying a potential difference between said first and said second sense nodes;

a first pair of bit lines from said plurality of pairs of bit lines;

a first isolator circuit for selectively coupling said first pair of bit lines to said first sense node and said second sense node in response to a first multiplexing signal;

a second pair of bit lines from said plurality of pairs of bit lines;

a second isolator circuit for selectively coupling said second pair of bit lines to said first sense node and said second sense node in response to a second multiplexing signal;

a first equalizer circuit, operatively connected between said first pair of bit lines, for connecting said first pair of bit lines in response to a first equalization signal;

a second equalizer circuit, operatively connected between said second pair of bit lines, for connecting said second pair of bit lines in response to a second equalization signal; and a precharge corresponding to said sense circuit, consisting essentially of a single precharge device circuit operatively connected between said first pair of bit lines and between said second pair of bit lines, for charging said first pair of bit lines, said second pair of bit lines, said first sense node and said second sense node to a common voltage in response to a charging signal applied to said precharge circuit during a precharge operation, said first pair of bit lines, said second pair of bit lines, said first sense node and said second sense node being electrically coupled to each other during said precharge operation by simultaneously supplying said first equalization signal, said second equalization signal, said first multiplexing signal and said second multiplexing signal.

6. The sense amplifier circuit of claim 5, wherein said precharge circuit is adapted to limit an amount of charging current supplied from said charging signal to charge said first pair of bit lines, said second pair of bit lines, said first sense node and said second sense node to said common voltage during said precharge operation.

7. The sense amplifier circuit of claim 5, wherein said precharge circuit is adapted to limit an amount of leakage current flowing from one of said first pair of bit lines and said second pair of bit lines or both to said precharge circuit.

8. A semiconductor memory having a sense amplifier array comprising a plurality of sense amplifiers of the type specified in claim 5, wherein said precharge circuit is alternately connected between said first bit pair of bit lines and said second pair of bit lines as between adjacent ones of said sense amplifiers in said array.

9. In a semiconductor memory having a memory array including a plurality of memory cells each having an associated charge representing a logic state, said memory further including a plurality of bit lines connected to said plurality of memory cells, and a plurality of wordlines for accessing a corresponding one of said memory cells, an interleaved sense amplifier circuit, comprising:

a sense circuit having a first sense node and a second sense node for sensing and amplifying a potential difference between said first and second sense nodes; said first sense node being selectively coupled to a first bit line through a first isolation transistor and a second bit line coupled through a second isolation transistor, said second sense node being selectively coupled to a third bit line through a third isolation transistor and a fourth bit line through a fourth isolation transistor;

a first equalization transistor, connected between said first bit line and said third bit line, for coupling said first bit line to said third bit in response to a first equalization signal;

a second equalization transistor, connected between said second bit line and said fourth bit line, for coupling said second bit line and said forth bit line in response to a second equalization signal;

a precharge circuit, corresponding to said sense circuit, consisting essentially of a single precharge device operatively connected to one of said first equalization transistor and said second equalization transistor, for receiving a charging voltage and charging said first, second, third and fourth bit lines and said first and second sense nodes to a common voltage during a precharge operation in which said first and second equalization signals are supplied to couple said first and third bit lines and couple said second and fourth bit lines, respectively, and said first and second isolation transistors are energized to couple said first and second bit lines to said first sense node and said third and fourth isolation transistors are energized to couple said third and fourth bit lines to said second sense node, said precharge circuit being adapted to limit an amount of current supplied by said charging voltage during said precharge operation.

10. The sense amplifier of claim 9, wherein said precharge circuit is further adapted to limit an amount of leakage current generated as a result of a short circuit connection between one of said first, second, third and fourth bit lines and a corresponding one of said wordlines.

* * * * *